(12) United States Patent
Huang et al.

(10) Patent No.: US 7,186,658 B2
(45) Date of Patent: Mar. 6, 2007

(54) METHOD AND RESULTING STRUCTURE FOR PCMO FILM TO OBTAIN ETCHING RATE AND MASK TO SELECTIVELY BY INDUCTIVELY COUPLED PLASMA

(75) Inventors: Kenlin Huang, Fremont, CA (US); Kaicheng Chou, San Jose, CA (US); Harry Luan, Saratoga, CA (US); Jein-Chen Young, Milpitas, CA (US); Arthur Wang, San Jose, CA (US)

(73) Assignee: Winbond Electronics Corporation, Hsin-Chu (TW)

( * ) Notice: Subject to any disclaimer, the term of this patent is extended or adjusted under 35 U.S.C. 154(b) by 36 days.

(21) Appl. No.: 10/854,755

(22) Filed: May 24, 2004

(65) Prior Publication Data

US 2005/0260857 A1 Nov. 24, 2005

(51) Int. Cl.
*H01L 21/302* (2006.01)
*H01L 21/461* (2006.01)
(52) U.S. Cl. ...................... 438/706; 438/734
(58) Field of Classification Search ............. 438/706, 438/734
See application file for complete search history.

(56) References Cited

U.S. PATENT DOCUMENTS 6,328,845 B1* 12/2001 Ohmoto et al. ........ 156/345.44
2002/0014676 A1* 2/2002 Marty et al. ................ 257/506
2003/0059720 A1* 3/2003 Hwang et al. ............. 430/311
2005/0079727 A1* 4/2005 Zhang et al. ............... 438/734
2005/0230724 A1* 10/2005 Hsu .......................... 257/295

OTHER PUBLICATIONS

Beck et al., "Reproducible switching effect in thin oxide films for memory applications", Applied Physics Letters, vol. 77, No. 1, Jul. 3, 2000, pp. 139-141.
Lee et al., "Dry etching to form submicron features in CMR oxides", Mat. Res. Soc. Symp. Proc. vol. 574, pp. 341-346, no date avail.
Liu et al., "Electric-pulse-induced reversible resistance change effect in magnetoresistive films", Applied Physics Letters, vol. 76, No. 19, May 8, 2000, pp. 2749-2751.
Zhuang et al., Novell colossal magnetoresistive thin film nonvolatile resistance random access memory (RRAM), IEEE, 2002.

* cited by examiner

*Primary Examiner*—Nadine Norton
*Assistant Examiner*—Mahmoud Dahimene
(74) *Attorney, Agent, or Firm*—Townsend and Townsend and Crew LLP

(57) ABSTRACT

A high selectivity and etch rate with innovative approach of inductively coupled plasma source. Preferably, the invention includes a method using plasma chemistry that is divided into main etch step of (e.g., $Cl_2$+HBr+$C_4F_8$) gas combination and over etch step of (e.g., HBr+Ar). The main etch step provides a faster etch rate and selectivity while the over etch step will decrease the etch rate and ensure the stringer and residue removal without attacking the under layer.

24 Claims, 6 Drawing Sheets

BOILING POINT (°C) AT 1atm

Chlorides

| | |
|---|---|
| AlCl$_3$ | 177.8 |
| SiCl$_4$ | 57.6 |
| Cu$_2$Cl$_2$ | 1490 |
| TiCl$_4$ | 136.4 |
| WCl$_6$ | 346.7 |

Fluorides

| | |
|---|---|
| AlF$_3$ | 1291 |
| SiF$_4$ | -86 |
| Cu$_2$F$_2$ | 1100 |
| TiF$_4$ | 284 |
| WF$_6$ | 17.5 |

| Chemistry | Primary Films Etched |
|---|---|
| Cl-based (Cl$_2$, BCl$_3$) | Al alloys, Ti, TiN, resist |
| F-based (SF$_6$, CF$_4$, CHF$_3$) | W, TiW, SiO$_2$, resist |
| O-based (O$_2$, O$_3$, CO$_2$, H$_2$O) | Resist |

FIGURE 5

1500 A SiNx hardmask, 025 um pitch

METHOD AND RESULTING STRUCTURE FOR PCMO FILM TO OBTAIN ETCHING RATE AND MASK TO SELECTIVELY BY INDUCTIVELY COUPLED PLASMA

BACKGROUND OF THE INVENTION

The present invention is directed to integrated circuits and their processing for the manufacture of semiconductor devices. More particularly, the invention provides a method and device for patterning films of PCMO ($Pr_{0.7}Ca_{0.3}MnO_3$) using an etching process. Merely by way of example, the invention has been applied to a resistive material for resistance random access memory (RRAM) devices. But it would be recognized that the invention has a much broader range of applicability. For example, the invention can be applied to microprocessor devices, memory devices, and application specific integrated circuit devices.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of such a limit is the ability to pattern certain materials for memory devices. These materials include PCMO, which has been proposed for RRAM devices.

As background information, PCMO materials have been known. A large electric-pulse-induced reversible resistance change active at room temperature and under zero magnetic field has been discovered in colossal magnetoresistive (CMR) $Pr_{0.7}Ca_{0.3}MnO_3$ thin films. Electric field-direction-dependent resistance changes of more than 1700% were observed under applied pulses of 100 ns duration and as low as 6.5 V magnitude. This electrically induced effect, observed in CMR materials at room temperature has both the benefit of a discovery in materials properties and the promise of applications for thin film manganites in the electronics arena including high-density nonvolatile memory. In conventional NiFe-based giant magnetoresistance materials, the patterning is generally performed by ion beam milling because of the relatively low volatility of metal halide etch products. It was reported that $Cl_2$/Ar discharges operated under high density plasma conditions can provide practical etch rates for NiFe and related materials. Unfortunately, limited work has been performed in the CMR materials. It is considered difficult to etch the thin film of PCMO because of non-volatility of etch byproducts from Pr, Ca, and Mn, and possibly others. Ion mill can not provide enough mask selectivity which will be a serious concern as the device size continues to shrink beyond 0.13 um technology.

It has long been known that bulk ceramic and single-crystal specimens of hole-doped manganites of the basic perovskite structure $La_{1-x}M_xMnO_3$ (where M is typically Ba, Sr, Ca, or Pb) display a large magnetoresistance (MR). The subsequent discovery of a large room temperature MR in thin films of doped manganate perovskite opened up the possibility of applications in read heads for hard disk drives, sensors and magnetic random access memories (MRAM). This was followed by the reports of a very large negative MR at 77K in thin film $La_{0.67}Ca_{0.33}MnO_3$, termed colossal magnetoresistance (CMR). Conventional efforts have been focused on obtaining high MR ratios at lower magnetic fields than in the original reports and at higher temperatures. Chemical substitution on the trivalent site is observed to improve MR behavior, since interatomic distance influences the magnetic-exchange interactions between the cations. Therefore, Nd- and Pr-based manganites are expected to show improved MR behavior relative to La-based compounds. In addition large MR values have been achieved in $LaMMnO_3/SrTiO_3/LaMMnO_3$ trilayers (M=Ca or Sr) at low fields. To fabricate spin-valve read heads or MRAM elements it is necessary to develop pattern transfer processes for the manganites. In conventional NiFe-based giant magnetoresistance materials, the patterning is generally performed by ion beam milling because of the relatively low volatility of metal halide etch products. In LaCaMnO3, they found that iodine and bromine plasma chemistries proved some degree of chemical enhancement in the etch mechanism. These and other limitations of conventional fabrication techniques can be found throughout the present specification and more particularly below.

From the above, it is seen that an improved technique for processing semiconductor devices is desired.

BRIEF SUMMARY OF THE INVENTION

According to the present invention, techniques directed to integrated circuits and their processing for the manufacture of semiconductor devices are provided. More particularly, the invention provides a method and device for patterning films of PCMO ($Pr_{0.7}Ca_{0.3}MnO_3$) using an etching process. Merely by way of example, the invention has been applied to a resistive material for resistance random access memory (RRAM) devices. But it would be recognized that the invention has a much broader range of applicability. For example, the invention can be applied to microprocessor devices, memory devices, and application specific integrated circuit devices.

In a specific embodiment, the invention provides for a high selectivity and etch rate with innovative approach of inductively coupled plasma source. Preferably, the invention includes a method using plasma chemistry that is divided into main etch step of (e.g., $Cl_2$+HBr+$C_4F_8$) gas combination and over etch step of (e.g., HBr+Ar). The main etch step provides a faster etch rate and selectivity while the over etch step will decrease the etch rate and ensure the stringer and residue removal without attacking the under layer.

In other embodiments, the invention provides for a process where the bottom electro-static chuck temperature can be maintained at greater than 250° Celsius to promote the volatility of etch byproducts while the source power will be less than 100 Watts and bias power greater than 1000 Watts.

In a specific embodiment, the invention includes a system and method using 400 kHz in bias power to increase the degree of ion bombard.

In a specific embodiment, the present invention provides a method for patterning a film of PCMO material. The starting materials include a film of PCMO overlying the surface of the substrate and a hard mask overlying the PCMO film overlying the substrate. The hard mask includes an exposed portion. The method includes subjecting the film of material during a main etch process to a chlorine bearing species to initiate removal of the exposed portion of the PCMO film. A step of subjecting the film of material to HBr and argon species to remove any residual stringer material caused from the removal of the PCMO film during an over etch process is included.

In an alternative specific embodiment, the present invention includes an alternative method for patterning a film of PCMO material. The method includes providing a substrate, which has a surface. The method includes forming a film of PCMO overlying the surface of the substrate and forming a hard mask overlying the PCMO film overlying the substrate. The hard mask includes an exposed portion. The method includes subjecting the film of material during a main etch process to a chlorine bearing species to initiate removal of the exposed portion of the PCMO film and continuing removal of the exposed portion of the PCMO film using the chlorine bearing species during the main etch process. The method subjects the film of material to HBr and argon species to remove any residual stringer material caused from the removal of the PCMO film during an over etch process.

Many benefits are achieved by way of the present invention over conventional techniques. In a specific embodiment, the invention provides a method and system to integrate the CMR materials into the existing conventional semiconductor process technology and fabrication methods without plasma charging damage issues. Additionally, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention provides for an improved etching technique with higher throughput than conventional technologies. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

BRIEF DESCRIPTION OF THE DRAWINGS

FIG. 5 is a plot of boiling points for chlorides and fluorides according to embodiments of the present invention.

DETAILED DESCRIPTION OF THE INVENTION

According to the present invention, techniques directed to integrated circuits and their processing for the manufacture of semiconductor devices are provided. More particularly, the invention provides a method and device for patterning films of PCMO ($Pr_{0.7}Ca_{0.3}MnO_3$) using an etching process. Merely by way of example, the invention has been applied to a resistive material for resistance random access memory (RRAM) devices. But it would be recognized that the invention has a much broader range of applicability. For example, the invention can be applied to microprocessor devices, memory devices, and application specific integrated circuit devices.

Figure 1:
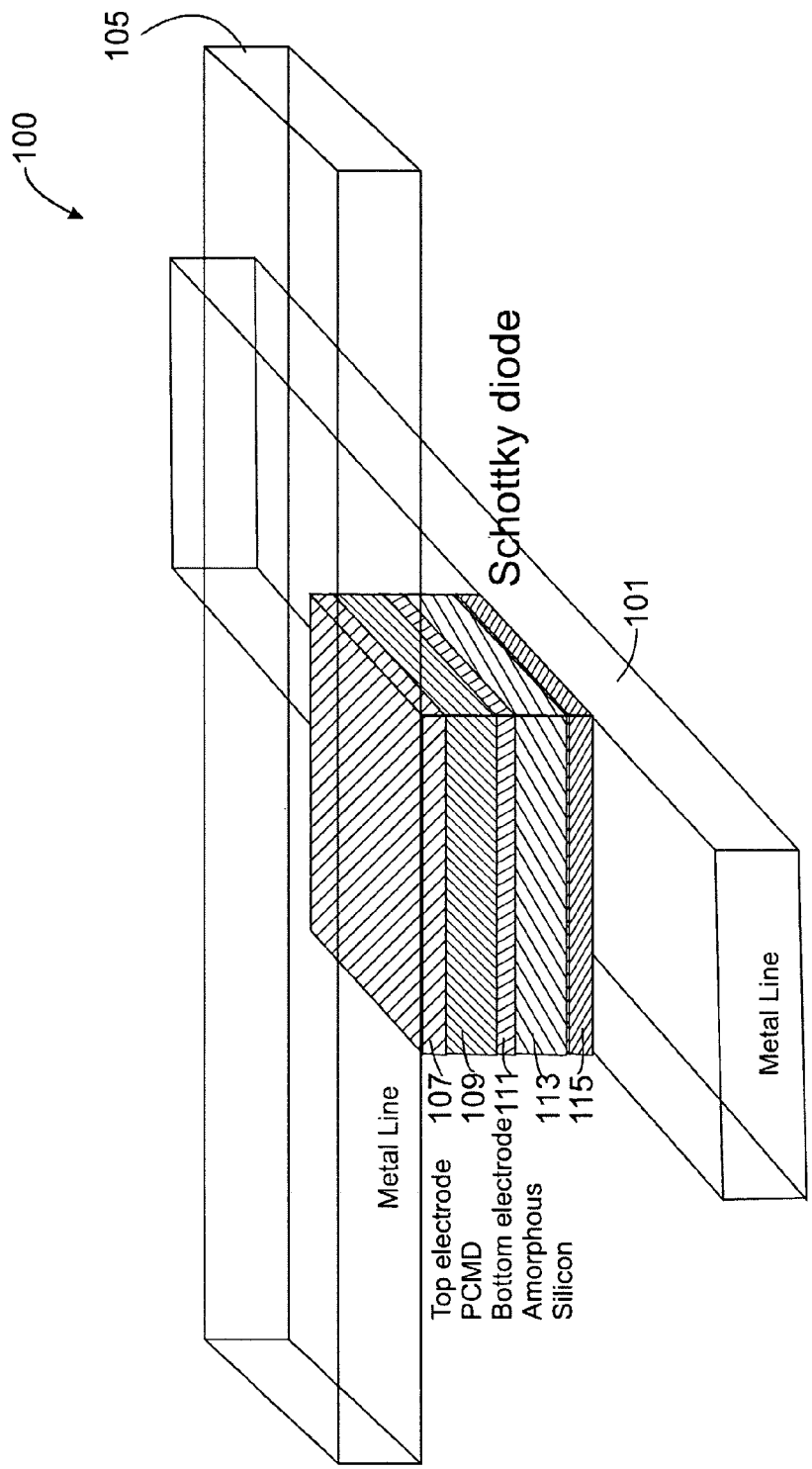
FIG. 1 is a simplified diagram of an RRAM device according to an embodiment of the present invention.

FIG. 1 is a simplified diagram of an RRAM device 100 according to an embodiment of the present invention. This diagram is merely an example, which should not unduly limit the scope of the claims herein. One of ordinary skill in the art would recognize many variations, modifications, and alternatives. As shown, the device includes a first metal line 101 in a first direction. A second metal line 105 intersects the first metal line in a perpendicular manner. Between the first metal line and the second metal line is a stacked structure, which includes various layers. Such layers include top electrode 107, which connects to the second metal line. Underlying the top electrode is PCMO film 109. A bottom electrode 111 underlies the PCMO film. An amorphous silicon layer underlies the bottom electrode, which sits on silicon layer 115. The silicon layer is coupled to the first metal layer 101. The stacked structure forms the RRAM device, which occupies a cell within an array of RRAM devices. That is, each of the RRAM devices is formed on an intersection between an array of metal lines. Each intersection portion forms a cell that is among a plurality of cells. Further details of the present RRAM devices can be found throughout the present specification and more particularly below.

Figure 2:
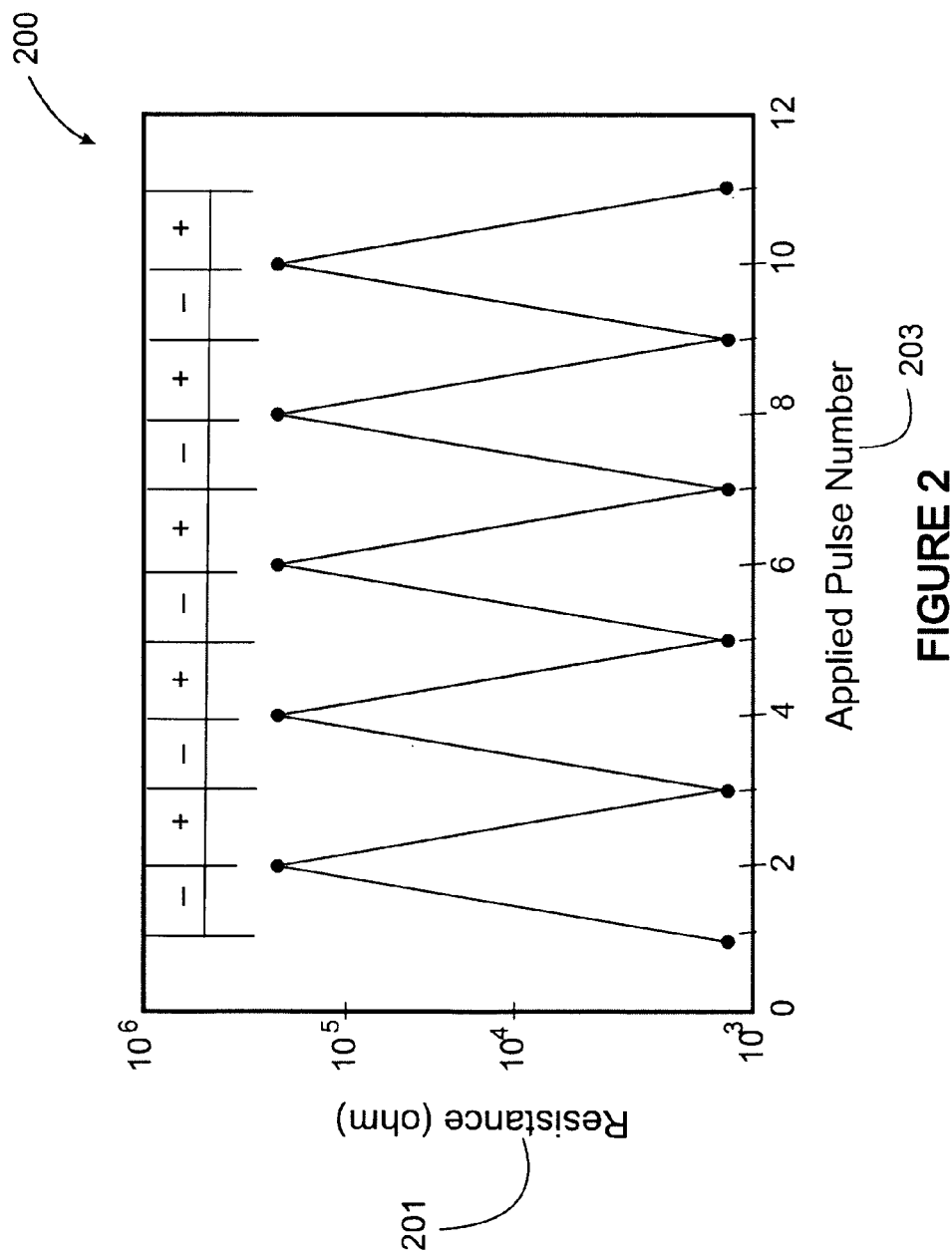
FIG. 2 is a simplified plot illustrating resistance against pulse number for an RRAM device according to an embodiment of the present invention.

FIG. 2 is a simplified plot 200 illustrating resistance against pulse number for an RRAM device according to an embodiment of the present invention. This diagram is merely an example, which should not unduly limit the scope of the claims herein. One of ordinary skill in the art would recognize many variations, modifications, and alternatives. As shown, a vertical axis illustrates "Resistance" 201 that is plotted against "Applied Pulse Number 203." As shown, the pulse number begins at 1 and runs to 12. Each of the pulses applies negative or positive potential between the metal lines of the RRAM device. As shown, the pulses have been defined as follows:

| Pulse Number | Potential |
|---|---|
| 1 | − |
| 2 | + |
| 3 | − |
| 4 | + |
| 5 | − |

-continued

| Pulse Number | Potential |
|---|---|
| 6 | + |
| 7 | − |
| 8 | + |
| 9 | − |
| 10 | + |
| 11 | − |
| 12 | + |

As shown, resistance various by at least two orders of magnitude from $10^3$ Ohms to more than $10^5$ Ohms. Here, RRAM's characterization as a colossal magneto resistive thin film resistor that changes resistance depending upon electrical pulse polarity and duration is illustrated. Further details of the present RRAM device can be found throughout the present specification and more particularly below.

Figure 3:
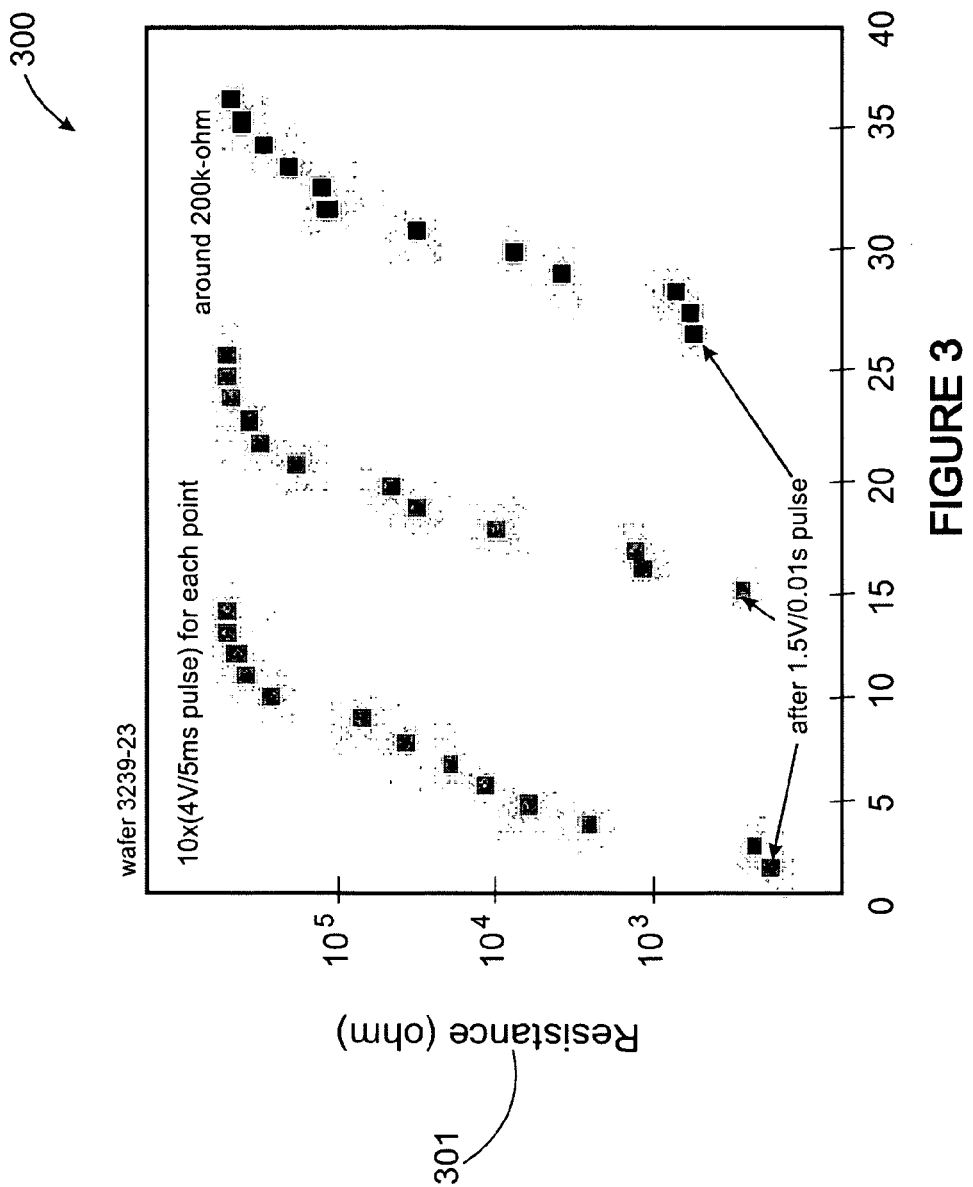
FIG. 3 is a simplified diagram of resistance measurements according to an alternative embodiment of the present invention.

FIG. 3 is a simplified diagram of multilevel resistance measurements 300 for an RRAM device according to an alternative embodiment of the present invention. This diagram is merely an example, which should not unduly limit the scope of the claims herein. One of ordinary skill in the art would recognize many variations, modifications, and alternatives. As shown, the horizontal axis represents voltage and the vertical axis represents resistance. Here, multilevel resistance states using different pulse voltage and width (refer to plots) have been demonstrated. See, IEDM 2002, Novell Colossal Magneto-resistive Thin Film Non volatile Resistance Random Access Memory. Details of ways to fabricate the present RRAM device can be found throughout the present specification and more particularly below.

A method for forming a patterned film of PCMO for the RRAM device according to the present invention may be provided as follows:

1. Provide a substrate, e.g., silicon wafer;
2. Form a film of PCMO overlying the surface of the substrate;
3. Form a hard mask overlying the PCMO film overlying the substrate, the hard mask including an exposed portion;
4. Subject the film of material to a chlorine bearing species to initiate removal of the exposed portion of the PCMO film;
5. Continue removal of the exposed portion of the PCMO film using the chlorine bearing species;
6. Subject the film of material to HBr and argon species to remove any residual stringer material caused from the removal of the PCMO film; and
7. Perform other steps, as desired.

The above sequence of steps provides a method according to an embodiment of the present invention. Other alternatives can also be provided where steps are added, one or more steps are removed, or one or more steps are provided in a different sequence without departing from the scope of the claims herein. Further details of the present method can be found throughout the present specification and more particularly below.

In order to integrate the CMR materials such as PCMO film into CMOS process technology, high mask selectivity and etch rate are desirable factors in determining successful application. Preferably, the present invention provides for high selectivity and etch rate with an innovative approach of plasma chemistry and hardware modification with inductively coupled plasma source. The present plasma chemistry can be divided into main etch step of (e.g., $Cl_2$+HBr+$C_4F_8$) gas combination and an over etch step of (e.g., HBr+Ar). The main etch step provides a faster etch rate and selectivity while the over etch step decreases the etch rate and ensure the stringer and residue removal without attacking the under layer. The bottom ESC chuck temperature is maintained at greater than 250° Celsius to promote the volatility of etch byproducts while the source power will be less than 100 Watts and bias power greater than 1000 Watts. In addition, the present method implements 400 kHz in bias power to increase the degree of ion bombard. According to the present invention, it is possible to integrate the CMR materials into conventional semiconductor process technology and fabrication methods without plasma charging damage issues. Details of certain chemical mechanisms can be found below.

Figure 4:
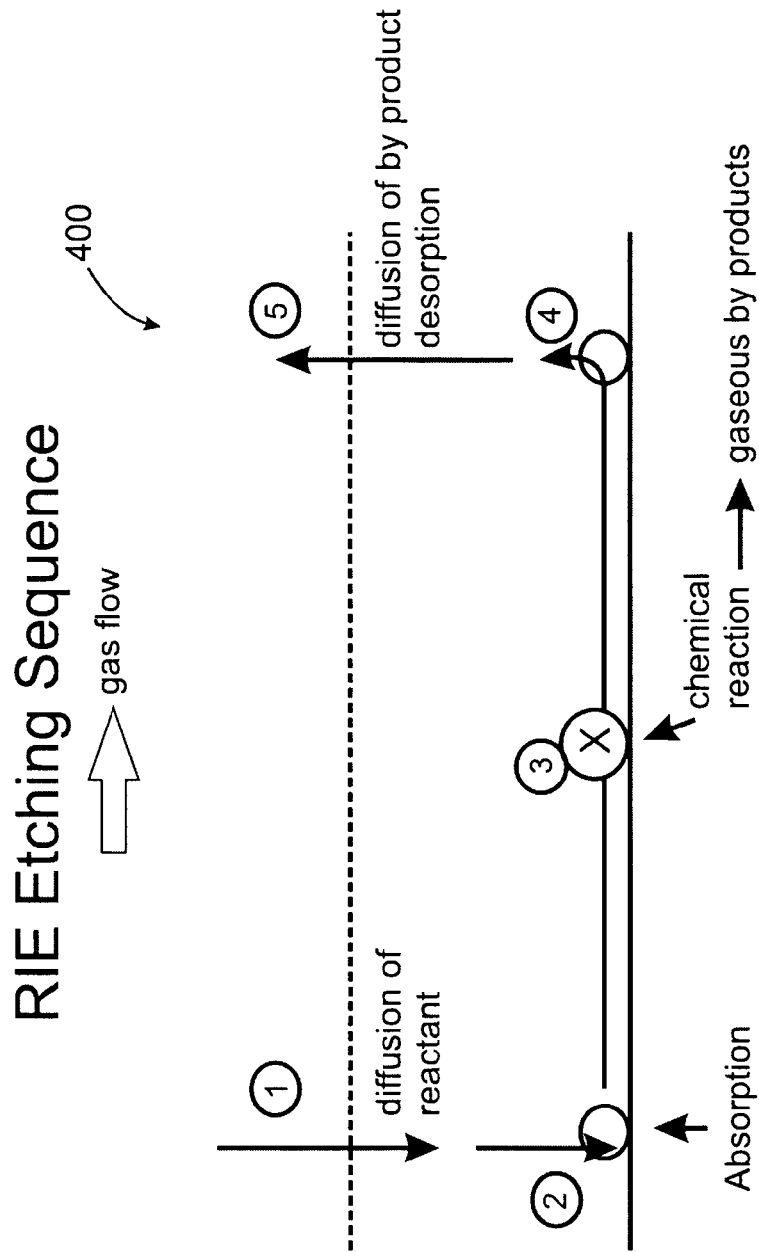
FIG. 4 is a simplified diagram illustrating an etching sequence according to an embodiment of the present invention.

FIG. 4 is a simplified diagram illustrating an etching sequence 400 according to an embodiment of the present invention. This diagram is merely an example, which should not unduly limit the scope of the claims herein. One of ordinary skill in the art would recognize many variations, modifications, and alternatives. As shown, the etching sequence includes: (1) diffusion of reactant; (2) absorption; (3) chemical reaction; (4) desorption; and (5) diffusion. Reactant gases are also shown as flowing past the substrate. Volatile products are also shown. The present method for patterning the PCMO film uses the etching sequence or mechanism outlined above. Chlorine bearing species are used to etch the PCMO film using additional steps, as desired.

FIG. 5 is a plot of boiling points for chlorides and fluorides from literature. This diagram is merely an example, which should not unduly limit the scope of the claims herein. One of ordinary skill in the art would recognize many variations, modifications, and alternatives. As shown, chlorine based chemistries can have lower boiling points in Celsius at 1 atmosphere pressure. The method uses chlorine based chemistry although other chemistries such as carbon-fluorine chemistry can also be used. Specific details of the present method for patterning the PCMO film have been described in more detail according to the Figures below.

Figure 6:
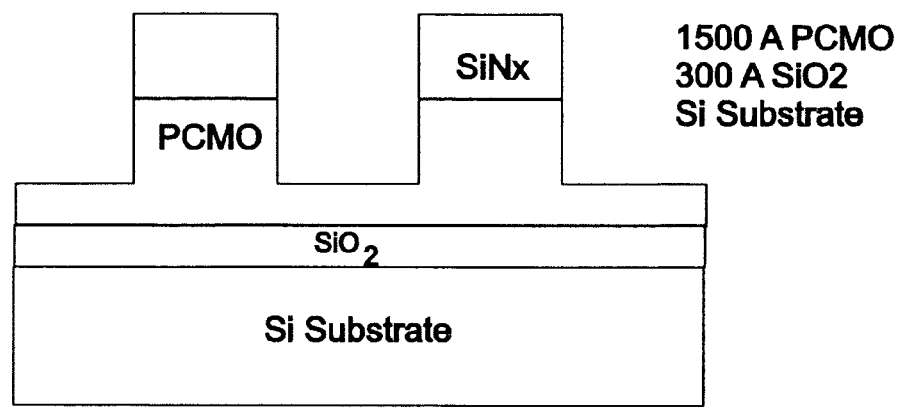
FIGS. 6 and 7 illustrate a method for processing an RRAM device according to embodiments of the present invention
Figure 7:
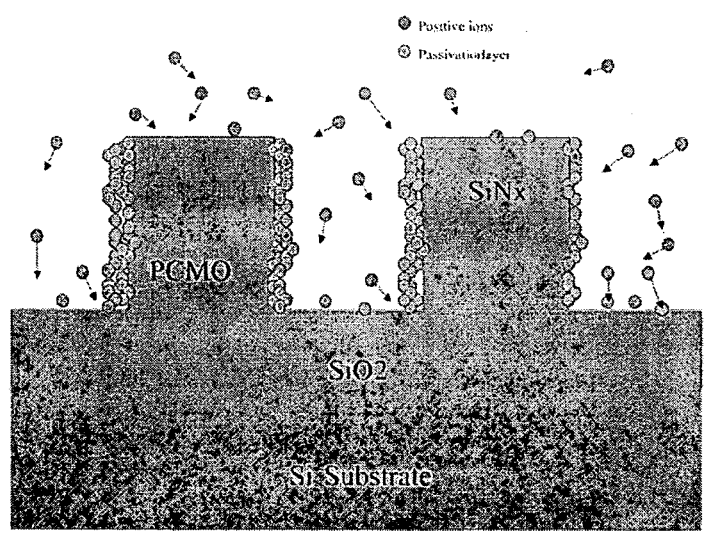

FIGS. 6 and 7 illustrate a method for processing an RRAM device according to embodiments of the present invention. These diagrams are merely examples, which should not unduly limit the scope of the claims herein. One of ordinary skill in the art would recognize many variations, modifications, and alternatives. As shown, the method includes using silicon substrate, which is a silicon wafer. A silicon dioxide layer is formed overlying the surface of the substrate. A PCMO film is overlying the silicon dioxide layer. According to a specific embodiment, the PCMO film has been deposited using a laser deposition process. In laser ablation, high-power laser pulses are used to evaporate matter from a target surface such that the stoichiometry of the material is preserved in the interaction. As a result, a supersonic jet of particles (plume) is ejected normal to the target surface. The plume, similar to the rocket exhaust, expands away from the target with a strong forward-directed velocity distribution of the different particles. The ablated species condense on the substrate placed opposite to the target.

The ablation process takes place in a vacuum chamber—either in vacuum or in the presence of some background gas. In the case of oxide films, oxygen is the most common background gas. In addition, the substrate temperature has to be sufficiently large (700–800° C.) and uniform across the whole substrate area to obtain epitaxial films. Laser-pulse energy density on the target should also be larger than a certain threshold value.

With a typical deposition rate (0.1 nm/pulse), a few thousand laser pulses are desired. The film area is determined by the dimensions of the central part of the plume and it is typically 1 cm². The area can be increased by scanning the laser spot across the target or the plume across the substrate, by moving the substrate relative to the plume, or by increasing the target-substrate distance.

Preferably, the PCMO film has certain characteristics. Energy dispersive x-ray spectroscopy EDXS analysis of $Pr_{1-x}Ca_xMnO_3$ (PCMO) thin films grown in a pilot study revealed that the films contained a lower concentration of Ca than the target. In order to obtain films with a composition in the range $0.3<x<0.5$, an off-stoichiometry target with a composition $Pr_{0.4} Ca_{0.6} MnO_3$ is used. The structure of the as-deposited films was examined by x-ray diffraction. Measurements in the normal Bragg geometry show textured growth. Only the (002/) reflections were present in the spectra with the lattice parameter c57.55–60.05 Å. This value agrees well with that expected for material. The electrical resistivity of the samples was measured as a function of temperature and magnetic field using a standard dc four probe technique. It suggests that the conduction occurs via an activated process and that the samples exhibit insulating behavior at low temperatures. Below 80 K the resistance of the samples exceeds 108 Ohms. There are no features in the data which indicate the presence of charge ordering.

In a specific embodiment, the method includes forming a hard mask overlying the PCMO film overlying the substrate. The hard mask includes an exposed portion. Preferably, the hard mask can be made of a suitable material. Such material may include, among others, silicon nitride. The silicon nitride has been deposited using chemical vapor deposition techniques. The silicon nitride layer can have a thickness of about 1000 Angstroms or more. Preferably, the thickness of the silicon nitride layer is 1500 Angstroms. The silicon nitride layer has been patterned to the exposed regions. The exposed regions can include a pitch of 0.25 microns or less, depending upon the application. Of course, one of ordinary skill in the art would recognize other modifications, alternatives, and variations.

Referring to FIG. 7, the method includes subjecting the film of material during a main etch process to a chlorine bearing species to initiate removal of the exposed portion of the PCMO film. In a specific embodiment, the chlorine bearing species can include, but is not limited to $Cl_2$, $BCl_3$, $C_4F_8$, any combination of these, and the like. The chlorine bearing species can be mixed with hydrogen bromide, $BCl_3$, or inertia gases, depending upon the application. The main etch process removes a substantial portion of the PCMO layer, as shown.

Preferably, the main etch is carried out in a plasma environment that uses the chlorine bearing species. The plasma environment is provided using an inductive coupled plasma such as a model 790 system manufactured by Plasma Therm, but can be others. Etching was performed in a Plasma Therm 790 system with the samples thermally bonded to a He backside-cooled, rf-powered (13.56 MHz) chuck. The plasma was generated in a cylindrical geometry, 3-turn coil source operating at 2 MHz and powers up to 1000 W. The $Cl_2$ and Ar gases were injected into the ICP source though electronic mass flow controllers at a total gas load of 15 standard cubic centimeters per minute (sccm). The process pressure was held constant at 5 mTorr. Etch rates were obtained by stylus profilometry after removal of the mask material (either Apiezon wax or plasma enhanced, chemically vapor deposited SiNx), while surface morphology and anisotropy were examined by atomic force microscopy (AFM) and scanning electron microscopy (SEM).

The method also includes continuing removal of the exposed portion of the PCMO film using the chlorine bearing species during the main etch process and then subjecting the film of material to HBr and argon species to remove any residual stringer material caused from the removal of the PCMO film during an over etch process is included. The HBr and argon bearing species will provide high selectivity, reduce the etch rate, removing any residue or stringer and preserving the smoothness of underlying $SiO_2$. Of course, one of ordinary skill in the art would recognize other modifications, alternatives, and variations.

Preferably, the present method is carried out using certain other process conditions. The power applied during the plasma etching process can be 400 kHz or other lower frequencies at about 100 to 1000 Watts. Preferably, ion bombardment is enhanced using such frequency or frequencies. The method also maintains the etching process at a temperature ranging from about 200° Celsius to about 300° Celsius and preferably 250° Celsius in certain embodiments. Preferably, removal of the PCMO film is at an etching rate of 1000 Angstroms per minute using the chlorine based chemistry and selected process parameters, as noted.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for patterning a film of PCMO material, the method comprising:
   providing a substrate, the substrate including surface;
   forming a film of PCMO overlying the surface of the substrate;
   forming a hard mask overlying the PCMO film overlying the substrate, the hard mask including an exposed portion;
   subjecting the film of PCMO material to a gas mixture to initiate removal of the exposed portion of the film of PCMO material, the gas mixture comprising a chlorine bearing species, hydrogen bromide, and a fluorine bearing species;
   continuing removal of the exposed portion of the PCMO film using said gas mixture, said gas mixture comprising a chlorine bearing species, hydrogen bromide, and a fluorine bearing species; and
   subjecting the film of material to HBr and argon species to remove any residual stringer material caused from the removal of the PCMO film.

2. The method of claim 1 wherein the substrate is maintained at 400 kHz to increase ion bombardment to remove products from the surface of the film.

3. The method of claim 1 wherein the substrate including the film is maintained at a temperature about 250° Celsius.

4. The method of claim 1 wherein the substrate is subjected to a top power of less than 200 Watts and the substrate is maintained at higher than 1000 Watts to increase bombardment.

5. The method of claim 1 wherein said gas mixture comprises $Cl_2$, HBr, and $C_4F_8$.

6. The method of claim 1 wherein the film of PCMO has a thickness ranging from 1500 Angstroms to 2000 Angstroms.

7. The method of claim 1 wherein the removal of the PCMO film is at an etching rate of 1000 A per minute.

8. The method of claim 1 wherein the film has a roughness of 0.3 nm.

9. The method of claim 1 wherein the hard mask is made of silicon nitride.

10. The method of claim 1 wherein the PCMO is provided by laser deposition.

11. The method of claim 1 wherein the film is provided on an RRAM device.

12. The method of claim 1 wherein the argon species is argon gas.

13. A method for patterning a film of PCMO material, the method comprising:
    providing a substrate, the substrate including surface;
    forming a film of PCMO overlying the surface of the substrate;
    forming a hard mask overlying the PCMO film overlying the substrate, the hard mask including an exposed portion;
    subjecting the film of PCMO material during a main etch process to a gas mixture to initiate removal of the exposed portion of the PCMO film, said gas mixture comprising a chlorine bearing species, hydrogen bromide, and a fluorine bearing species;
    continuing removal of the exposed portion of the PCMO film using said gas mixture during the main etch process, said gas mixture comprising a chlorine bearing species, hydrogen bromide, and a fluorine bearing species; and
    subjecting the film of material to HBr and argon species to remove any residual stringer material caused from the removal of the PCMO film during an over etch process.

14. The method of claim 13 wherein the substrate is maintained at 400 kHz or lower to increase ion bombardment to remove products from the surface of the film.

15. The method of claim 13 wherein the substrate including the film is maintained at a temperature about 250° Celsius.

16. The method of claim 13 wherein the substrate is provided with a top power of less than 200 Watts and the substrate is maintained at higher than 1000 Watts to increase bombardment.

17. The method of claim 13 wherein said gas mixture comprises $Cl_2$, HBr, and $C_4F_8$.

18. The method of claim 13 wherein the film of PCMO has a thickness ranging from 1500 Angstroms to 2000 Angstroms.

19. The method of claim 13 wherein the film is subjected to an etching rate of 1000 Angstroms per minute using the chlorine bearing species.

20. The method of claim 13 wherein the film has a roughness of 0.3 nm.

21. The method of claim 13 wherein the hard mask is made of silicon nitride.

22. The method of claim 13 wherein the PCMO is provided by laser deposition.

23. The method of claim 13 wherein the film is provided on an RRAM device.

24. The method of claim 13 wherein the argon species is argon gas.

* * * * *